United States Patent
Hwang et al.

(10) Patent No.: US 7,714,627 B1
(45) Date of Patent: May 11, 2010

(54) DOUBLE-TRIGGERED LOGIC CIRCUIT

(75) Inventors: Yin-Tsung Hwang, Yunlin County (TW); Jin-Fa Lin, Chiayi County (TW); Wei-Rong Ciou, Yunlin County (TW); Ming-Hwa Sheu, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 5 days.

(21) Appl. No.: 12/275,406

(22) Filed: Nov. 21, 2008

(51) Int. Cl.
*H03K 3/00* (2006.01)

(52) U.S. Cl. .................. 327/199; 327/212; 327/215

(58) Field of Classification Search .............. 327/199, 327/201, 208, 212, 215, 218, 223–225
See application file for complete search history.

(56) References Cited

U.S. PATENT DOCUMENTS

| | | | | |
|---|---|---|---|---|
| 5,347,184 | A * | 9/1994 | Stephens et al. | 326/93 |
| 6,462,596 | B1 * | 10/2002 | Varma | 327/218 |
| 6,489,825 | B1 * | 12/2002 | Pasqualini | 327/211 |
| 6,608,513 | B2 * | 8/2003 | Tschanz et al. | 327/218 |
| 7,180,351 | B2 * | 2/2007 | Hsieh et al. | 327/218 |

* cited by examiner

*Primary Examiner*—Hai L Nguyen
(74) *Attorney, Agent, or Firm*—Muncy, Geissler, Olds & Lowe, PLLC

(57) ABSTRACT

A double-triggered logic circuit is a composite circuitry consisting of a plurality of PMOS, NMOS, inverters and a signal line. It includes an AND logic circuit and a XNOR logic circuit to generate an adjustable pulse mode to solve the problem of threshold voltage loss.

5 Claims, 4 Drawing Sheets

DOUBLE-TRIGGERED LOGIC CIRCUIT

FIELD OF THE INVENTION

The present invention relates to a composite logic circuit and particularly to a double-triggered logic circuit.

BACKGROUND OF THE INVENTION

Nowadays, digital systems are increasingly diversified. How to reduce power consumption of chipsets is a one of main research focuses. Digital synchronous systems usually have one or more sets of clock systems. Clock signals are used to control data movement. The clock system consists of a clock system distribution network and a flip-flop. It consumes greatest power in the chipset. Power consumption can be divided into static power consumption and dynamic power consumption. The dynamic power consumption can be divided into switch power consumption and short circuit current power consumption. The static power consumption mostly is leakage power consumption.

The technique for reducing power can target reducing static power and reducing dynamic power. As the dynamic power consumption always is much greater than the static power consumption, design of circuits mainly focuses on reducing the dynamic power consumption. The most effective approach to reduce power consumption is lowering operation voltage. But lowering the voltage often results in lower speeds. Another alternative is adopting a double-edge trigger design. It can reduce power without decreasing throughput. Thus in practice of circuit design a pulse triggered flip-flop is adopted to reduce system clock loading capacitance and power consumption.

Refer to FIGS. 1 and 2 for the structure of a conventional flip-flop. It includes two latches. Clock signals have a positive edge and a negative edge to control data sampling and holding activities. Referring to FIG. 1, the master latch 1 performs data sampling and the slave latch 2 performs data holding. When in use, data is moved from a data input end (Din) 3 to a data output end (Qout) 4 in sync with an edge signal at a clock signal input end (Clock) 5. A positive edge triggered mode only samples a positive edge signal of the data input end (Din) 3 from the clock signal input end (Clock) 5, and a negative edge triggered mode samples a negative edge signal of the data input end (Din) 3 from the clock signal input end (Clock) 5. Then the data transmission can be accomplished. Thus every complete transaction of data transmission requires two clock signals.

Refer to FIG. 2 for the time series of the flip-flop shown in FIG. 1. A clock signal 6 has a positive edge to sample a data 7 and a negative edge to hold a data 8. Such a phenomenon creates a race trough problem. Hence a time factor that maintaining the flip-flop in normal duty conditions has to be taken into account.

The conventional double edge trigger flip-flop (hereafter is referred to as DETFF) requires only one clock signal 6 to complete the entire transaction of data transmission. A typical DETFF can save data at the positive edge or negative edge of the clock signal. But the transmission delay is longer. The driven loading capacitance at the clock signal input end (Clock) 5 also is greater. Although the clock signal input end (Clock) 5 at the positive edge or negative edge can save data, the original clock signal at the clock signal input end (Clock) 5 must have a double frequency to become a new clock signal. Hence the clock frequency used on the DETFF is one half of the clock frequency of the ordinary single edge triggered flip-flop. But a same data transmission rate can be achieved. As power consumption is proportional to the operational clock frequency, the consumed power also is lower. Hence DETFF is frequently adopted on power reducing designs.

Compared with the single edge triggered flip-flop, the DETFF has a more complex structure and requires a greater chipset size to contain more internal nodes and capacitor exchanging. And it results in the benefit of reducing the frequency is offset.

To address the aforesaid issues other techniques have been developed, such as explicit-pulsed-triggered flip-flop and implicit-pulsed-trigger flip-flop. Both of them can be further divided into a single-edge pulse triggered type and a double-edge pulse triggered type. When the explicit-pulsed-triggered flip-flop is adopted on multiple and serial-and-parallel circuits the pulse generator can be shared, but not so for the implicit-pulsed-trigger flip-flop. Hence total power consumption is much lower when the explicit pulsed-triggered flip-flop is adopted. However, in a serial-and-parallel environment a greater loading capacitance occurs that could result in not able to generate the pulses. As a result, the explicit-pulsed-triggered flip-flop does not provide as much benefits as the implicit-pulsed-trigger flip-flop does. Moreover, with addition of the pulse generator on the circuit, power consumption increases. The implicit-pulsed-trigger flip-flop also has a higher average duty frequency than the explicit-pulsed-triggered flip-flop.

As the pulse-triggered flip-flop provides a less complicated circuit design, it is increasingly accepted in applications of registers. The pulse generator has another important feature, namely control of its operation mode. The traditional pulse generator operates only in one mode. Refer to FIG. 3 for a conventional dual-mode logic circuit. It has a MUX circuit 9A to control two logic circuits, one is a AND logic circuit 9B and another is a XNOR logic circuit 9C. A mode selection signal input E is sent to the MUX circuit 9A as a transmission mode selection signal. Such a logic circuit requires a great number of transistors. Although the circuit is simpler, the loading capacitance of the clock signal input (CLK) 9D is greater and huge power consumption is caused.

On technical development for the design of lower power, multiple duty modes often is a requirement for single-pulse triggered or double-pulse triggered. For instance, at the stage of data synchronization on a data communication circuit, effective duty frequency can be doubled through the double-edge triggered mode. Once the stage of data synchronization is accomplished, the circuit can be switched to single-edge triggered to reduce the power consumption by the effective clock. It the past such a design usually requires pulse generators of two different modes. The single-edge pulse triggered circuit often includes an inverter and an AND or an OR logic gate to generate a positive or negative pulse signal. The double-edge pulse triggered circuit often includes an inverter and a XNOR logic gate and a XOR logic gate, and another MUX circuit to do selections.

On CMOS circuits of the conventional logic circuits, such as those for applications of XOR, XNOR, AND, OR and MUX, the circuits are relatively simple, but they have the problem of threshold voltage loss. The problem of threshold voltage loss is because circuits cannot function at a low voltage and consume a greater amount of power. Such a problem creates other problems on the circuits such as not adequate driving power and short circuit current. In short, adopted the conventional techniques to make a customized circuit are time-consuming and take great efforts. It requires a lot of time to design, execute, customize features and perform integration. There is a need for an improved circuit to provide desired time series specifications, minimum power consumption and enhanced processing speed.

SUMMARY OF THE INVENTION

Therefore the primary object of the present invention is to provide a double-triggered logic circuit that consists of two types of logic circuits and is structured at a lower complexity.

Based on the foregoing object the double-triggered logic circuit of the invention aims to connect a clock signal input end and a clock delay signal input end. It includes a first PMOS transistor, a second PMOS transistor, a first NMOS transistor, a second NMOS transistor and a third PMOS transistor.

The first PMOS transistor is connected to a mode selection signal input E and the clock delay signal input end. The second PMOS transistor is connected to the first PMOS transistor and the clock signal input end. The first NMOS transistor is connected to the first PMOS transistor. The second NMOS transistor is connected to the clock signal input end A and coupled with the third PMOS transistor. The second PMOS transistor, the first NMOS transistor, the second NMOS transistor and the third PMOS transistor are connected to generate an output signal.

By means of the structure set forth above, the double-triggered logic circuit of the invention can provide the following advantages:

1. The logic circuit thus formed has a logic gate consisting of a smaller number of transistors, thus electronic elements are fewer and complexity is lower and the loading capacitance of the clock system is reduced. Hence power consumption is greatly reduced. Furthermore, by adopting the dual operation mode, it is not limited to single usage but can meet requirements of wider applications.

2. To provide a simpler circuit design, the invention has no path of grounding power supply. Hence there is no significant short circuit current during switch of the transistors and no power consumption occurs. Operation difference of XNOR and AND logic circuits is used to control mode selection, so that the MUX circuit adopted in the conventional techniques can be omitted. As a result, the time delay is further reduced and power-delay-product (hereafter is referred to as PDP) also is lower.

The foregoing, as well as additional objects, features and advantages of the invention will be more readily apparent from the following detailed description, which proceeds with reference to the accompanying embodiments and drawings. The embodiments discussed below serve only for illustrative purpose and are not the limitations of the invention.

DETAILED DESCRIPTION OF THE PREFERRED EMBODIMENTS

The related details and techniques of the invention is further described as the following embodiments. The embodiments are used to illustrate the invention but not to limit practices of the invention.

Figure 4:
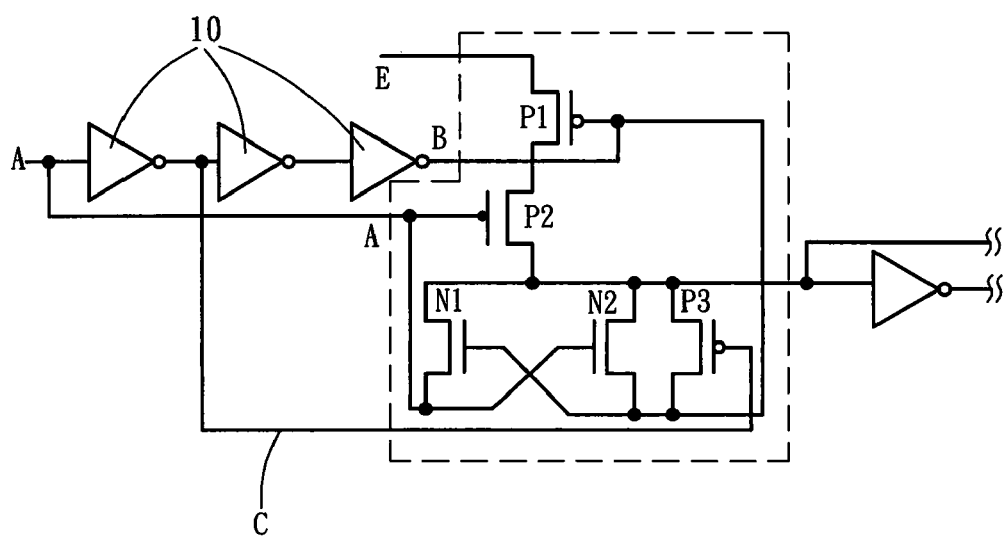
FIG. 4 is a circuit diagram of the double-triggered logic circuit of the invention.

Please referring to FIG. 4, the invention, a double-triggered logic circuit, provides a connection between a clock signal input end A and a clock delay signal input end B. It includes a first PMOS transistor P1, a second PMOS transistor P2, a first NMOS transistor N1, a second NMOS transistor N2 and a third PMOS transistor P3.

The first PMOS transistor P1 has a source connecting to a mode selection signal input E and a gate connecting to the clock delay signal input end B. The second PMOS transistor P2 has a source connecting to a drain of the first PMOS transistor P1 and a gate connecting to the clock signal input end A. The first NMOS transistor N1 has a gate connecting to the gate of the first PMOS transistor P1. The second NMOS transistor N2 has a gate connecting to the clock signal input end A and also is coupled with the third PMOS transistor P3. The drains of the second PMOS transistor P2 and the first NMOS transistor N1 and the sources of the second NMOS transistor N2 and the third PMOS transistor P3 are connected to generate an output signal.

In front of the clock delay signal input end B there is at least one first inverter 10. In an embodiment of the invention three sets of the first inverter 10 are provided to connect to the third PMOS transistor P3.

Figure 5:
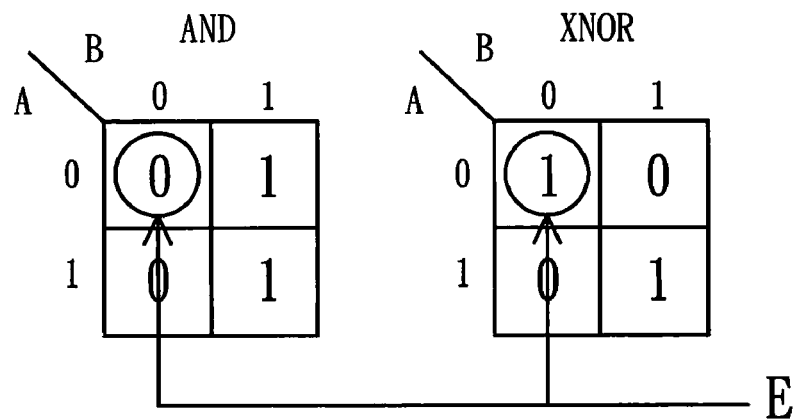
FIG. 5 is a truth table of an AND and a XNOR.

Also refer to FIG. 5 for the truth table of an AND and a XNOR. To reduce the circuit complexity, based on the truth table of an AND and a XNOR, when both the clock signal input end A and the clock delay signal input end B are "0" at the same time, output of the AND is "0" and output of the XNOR is "1". Such a difference can be used to control the selection of the mode selection signal input E.

Figure 1:
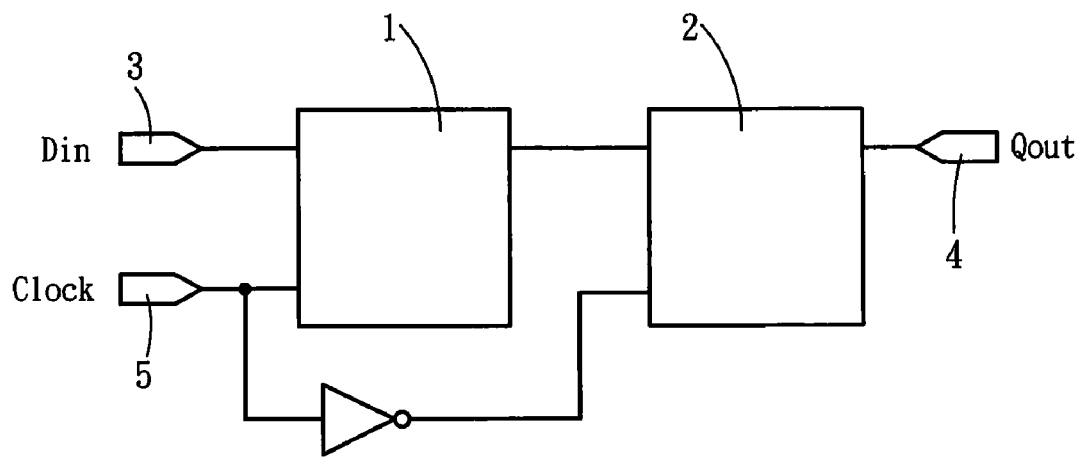
FIG. 1 is a schematic view of a conventional flip-flop.
Figure 2:
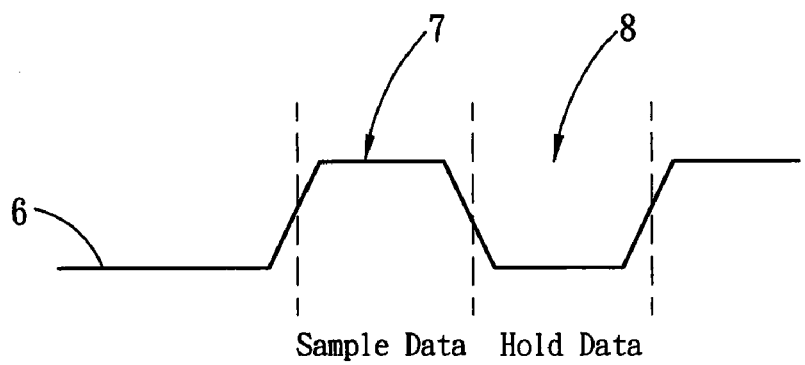
FIG. 2 is a schematic view of the time series of a conventional master-slave flip-flop.
Figure 3:
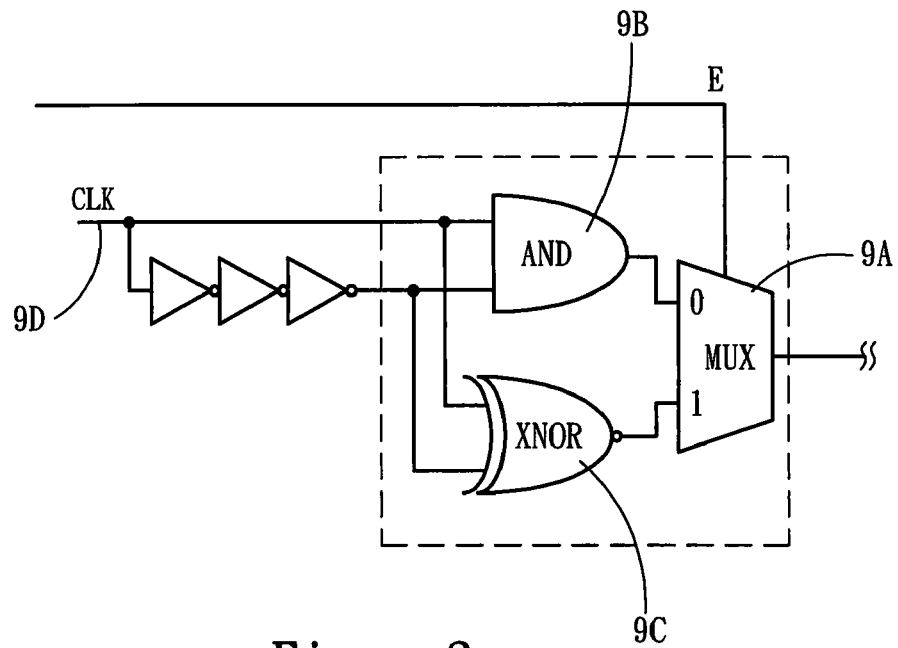
FIG. 3 is a schematic view of a conventional dual-mode logic circuit.
Figure 6:
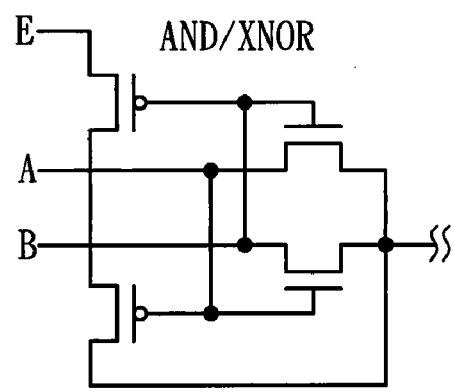
FIG. 6 is an AND/XNOR logic circuit diagram designed according to the truth table of an AND and a XNOR.
Figure 7:
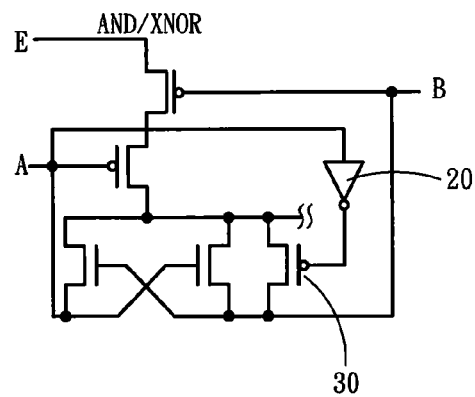
FIG. 7 is a circuit diagram to overcome threshold voltage loss.

Refer to FIG. 6 for an AND/XNOR logic circuit adopted FIG. 5. It does not have a direct power supply grounding path. Hence during switch of transistors, no obvious short current occurs to consume power. The circuit shown in FIG. 6 also does not have the conventional MUX circuit 9A shown in FIG. 3. Hence the time delay is reduced, and the PDP is lower. But it still has drawbacks. Referring to FIGS. 5 and 6, when the clock signal input end A, clock delay signal input end B and mode selection signal input end E have respectively input signals "000, 011 and 111", output still has the problem of threshold voltage loss. The conditions "011 and 111" take place during the clock positive edge is "0→1" when the circuit is adopted on a pulse generator. Referring to FIG. 7, such a problem can be overcome by adding a second inverter 20 and a transistor 30. It aims to resolve the problem of threshold voltage loss. If the circuit is adopted on a pulse generator (which not shown in the drawings), when the clock signal input end A, clock delay signal input end B and mode selection signal input end E have respectively an input signal EAB of "000, the circuit does not generate a pulse signal. Hence the input signal does not affect the circuit of the pulse generator. Therefore upon connecting to the pulse generator, since the pulse wave is narrower, the power consumption caused by short current also is lower. Thus there is no problem of threshold voltage loss.

Referring to FIGS. 4 and 7, the second inverter 20 in FIG. 7 can be replaced by the first inverter 10 shown in FIG. 4. In practice, the dual-mode logic circuit can be formed with five transistors as shown in FIG. 4. The invention, by having three sets of first inverter 10 to provide clock delay function and incorporating with the circuit shown in FIG. 7, can form the dual-mode logic circuit depicted in FIG. 4. The Boolean algebra formula of the circuit is as follow:

$$F=\overline{E}(A\oplus B)+E(A+B)$$

EMBODIMENT EXAMPLES

Figure 8:
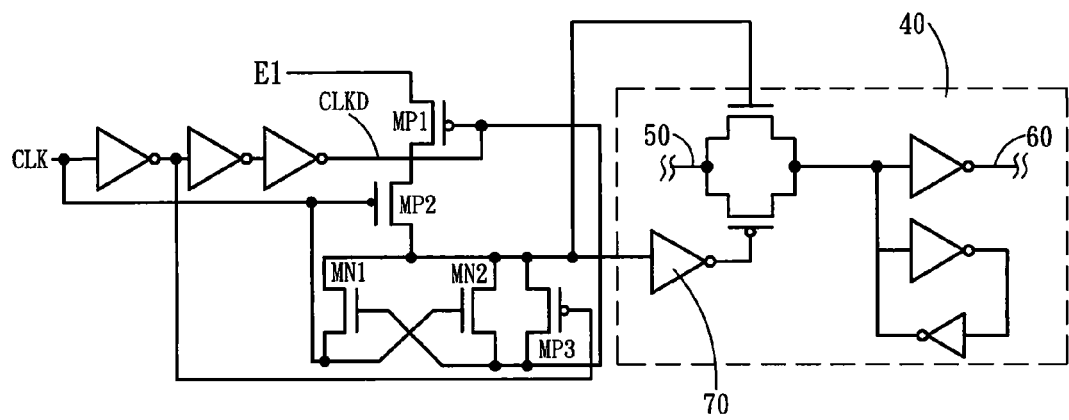
FIG. 8 is a circuit diagram of a double-pulse triggered flip-flop formed according to the invention.

Referring to FIGS. 5 and 8, a clock input signal CLK, a clock delay input signal CLKD and mode selection signal input E1 shown in FIG. 8 are to map the clock signal input end A, clock delay signal input end B and mode selection input signal E shown in FIG. 5. The circuit diagram is for a double-pulse mode triggered flip-flop formed according to the invention. Circuit operation is as follow:

(1) When the mode selection signal input E1 is "1" (double-edge pulse triggered generation mode):
  a. Both the clock input signal CLK and clock delay input signal CLKD are "0" (the clock input signal CLK is at a lower edge): a first transistor MP1 and a second transistor MP2 are in an ON condition, and generate a pulse signal "1" to set on a latch 40. Data is transmitted from a data input end 50 to a data output end 60;
  b. When both the clock input signal CLK and clock delay input signal CLKD are "1" (the clock input signal CLK is at an upper edge): a third transistor MN1, a fourth transistor MN2 and a fifth transistor MP3 are in an ON condition, and generate the pulse signal "1" to set on the latch 40. Data is transmitted from the data input end 50 to the data output end 60;
  c. When the clock input signal CLK and clock delay input signal CLKD are "01" or "10" (the clock input signal CLK is fixed: the third transistor MN1 or fourth transistor MN2 is in an "ON" condition and the pulse signal is "0" (no pulse generated), the latch 40 maintains the voltage at the data output end 60 through a circuit feedback function of a third inverter 70.

(2) When the mode selection signal input E1 is "0" (single-edge pulse triggered generation mode):
  a. Both the clock input signal CLK and clock delay input signal CLKD are "0" (the clock input signal CLK is at a lower edge): the first transistor MP1 and second transistor MP2 are in an ON condition, and the pulse signal is "0" (no pulse generated); the latch 40 maintains the voltage at the data output end 60 through the circuit feedback function of the third inverter 70;
  b. When both the clock input signal CLK and clock delay input signal CLKD are "1" (the clock input signal CLK is at an upper edge): the third transistor MN1, the fourth transistor MN2 and the fifth transistor MP3 are in an ON condition, the pulse signal is 1" (a pulse generated), and the latch 40 is set on. Data is transmitted from the data input end 50 to the data output end 60;
  c. When the clock input signal CLK and clock delay input signal CLKD are "01" or "10" (the clock input signal CLK is fixed: the third transistor MN1 or the fourth transistor MN2 is "ON" and the pulse signal is "0" (no pulse generated), the latch 40 maintains the voltage at the data output end 60 through the circuit feedback function of the third inverter 70.

As a conclusion, the double-triggered logic circuit provided by the invention employs AND/XNOR logic modules and can support two types of pulse triggered modes: a single-edge triggered mode and a double-edge triggered mode. It can save transistor number and layout size, and achieve high speed operation and consume less power, thus is adaptable to a wide scope of applications and offers significant improvement over the conventional techniques.

What is claimed is:

1. A double-triggered logic circuit to connect a clock signal input end and a clock delay signal input end, comprising:
  a first PMOS transistor which has a first source connecting to of a mode selection signal input and a first gate connecting to the clock delay signal input end;
  a second PMOS transistor which has a second source connecting to of a first drain of the first PMOS transistor and a second gate of the second PMOS transistor connecting to the clock signal input end;
  a first NMOS transistor which has a third gate connecting to the first gate of the first PMOS transistor; and
  a second NMOS transistor which is coupled with a third PMOS transistor and has a fourth gate connecting to the clock signal input end;
  wherein the second PMOS transistor has a second drain, the first NMOS transistor has a third drain and the second NMOS has a fourth source and the third PMOS has a third source that are connected together to generate an output signal.

2. The double-triggered logic circuit of claim 1, wherein the clock signal input end is selectively connected to a flip-flop, an adder and multiplexer, a latch, a register or a counter.

3. The double-triggered logic circuit of claim 1, wherein the clock signal input end and the clock delay signal input end are bridged by at least one inverter.

4. The double-triggered logic circuit of claim 3, wherein the inverter is provided at an optimal number of three sets.

5. The double-triggered logic circuit of claim 3, wherein the inverter is connected to the third PMOS transistor through a signal line.

* * * * *